United States Patent
Wada et al.

(10) Patent No.: US 12,199,526 B2
(45) Date of Patent: Jan. 14, 2025

(54) POWER CONVERSION DEVICE CONFIGURED TO OBSERVE CHIP TEMPERATURE

(71) Applicant: HITACHI ASTEMO, LTD., Hitachinaka (JP)

(72) Inventors: Shinichirou Wada, Tokyo (JP); Tomohiko Yano, Tokyo (JP); Yoichiro Kobayashi, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 233 days.

(21) Appl. No.: 17/927,217

(22) PCT Filed: Feb. 5, 2021

(86) PCT No.: PCT/JP2021/004247
§ 371 (c)(1),
(2) Date: Nov. 22, 2022

(87) PCT Pub. No.: WO2021/240891
PCT Pub. Date: Dec. 2, 2021

(65) Prior Publication Data
US 2023/0223867 A1    Jul. 13, 2023

(30) Foreign Application Priority Data
May 25, 2020    (JP) .................. 2020-090370

(51) Int. Cl.
*H02M 1/08* (2006.01)
*H01L 29/78* (2006.01)
(Continued)

(52) U.S. Cl.
CPC .... *H02M 7/53871* (2013.01); *H01L 29/7805* (2013.01); *H02M 1/0009* (2021.05); *H02M 1/088* (2013.01); *H02M 1/08* (2013.01)

(58) Field of Classification Search
CPC ...... H02M 1/0009; H02M 1/08; H02M 1/088; H02M 1/327; H02M 7/003; H02M 7/538;
(Continued)

(56) References Cited

U.S. PATENT DOCUMENTS

2006/0215341 A1* 9/2006 Sakurai .............. H03K 17/0828
361/100
2014/0362490 A1 12/2014 Maekawa et al.
(Continued)

FOREIGN PATENT DOCUMENTS

JP    2004-117111 A    4/2004
JP    2006-271098 A    10/2006
(Continued)

OTHER PUBLICATIONS

Extended European Search Report for corresponding EPO Application No. 21812305.7, dated Jun. 5, 2024, 7 pages.
(Continued)

*Primary Examiner* — Thienvu V Tran
*Assistant Examiner* — Shahzeb K Ahmad
(74) *Attorney, Agent, or Firm* — Foley & Lardner LLP (57) ABSTRACT

Provided is a power conversion device capable of observing a chip temperature with high accuracy without increasing a cost of the power conversion device mounted with a current sense element for observing a main current of a power device. A main control MOSFET 11, a current MOSFET 12, and a diode 13 connected to a source electrode 8 of the main control MOSFET 11 and a source electrode 9 of the current MOSFET 12 are mounted in a chip of a power device, a temperature measurement circuit 3 is connected to the source electrode 9 of the current MOSFET 12, and when the main control MOSFET 11 is in an off state, a forward current ($I_f$) is caused to flow through the diode 13, and an anode potential is observed to measure the chip temperature.

10 Claims, 11 Drawing Sheets

(51) Int. Cl.
  *H02M 1/00* (2006.01)
  *H02M 1/088* (2006.01)
  *H02M 7/5387* (2007.01)
(58) Field of Classification Search
  CPC ............ H02M 7/5387; H02M 7/53871; G01R 19/0092; G01R 19/165; G01R 19/16523; G01R 19/16519; H01L 29/7805; H01L 29/7815; H01L 29/78; H03K 17/12; H03K 17/14; H03K 17/145; H03K 2017/0806; H03K 2217/0027; H02P 27/08; G01K 7/01
  See application file for complete search history.

(56) References Cited

U.S. PATENT DOCUMENTS

| | | | |
|---|---|---|---|
| 2015/0346038 A1 | 12/2015 | Kaisha | |
| 2016/0116345 A1* | 4/2016 | Furtner | G01K 7/01 |
| | | | 374/178 |
| 2016/0233788 A1* | 8/2016 | Osanai | H02M 7/537 |
| 2018/0269864 A1 | 9/2018 | Akahane | |
| 2019/0273488 A1* | 9/2019 | Reiter | H02H 7/222 |
| 2020/0335492 A1 | 10/2020 | Hata et al. | |

FOREIGN PATENT DOCUMENTS

| | | | |
|---|---|---|---|
| JP | 2015-228771 A | | 12/2015 |
| JP | 2017175221 A | * | 9/2017 |
| WO | WO-2017/208698 A1 | | 12/2017 |
| WO | WO-2019/167104 A1 | | 9/2019 |

OTHER PUBLICATIONS

International Search Report with English Translation and Written Opinion issued in corresponding International application No. PCT/JP2021/004247, dated May 25, 2021.

* cited by examiner

POWER CONVERSION DEVICE CONFIGURED TO OBSERVE CHIP TEMPERATURE

TECHNICAL FIELD

The present invention relates to a power conversion device.

BACKGROUND ART

As next-generation automobiles, a hybrid automobile that rotates driving wheels by combining an internal combustion engine and an electric motor, and an electric automobile that rotates driving wheels only by an electric motor have attracted attention. Further, in an automobile motor used in these motors, a compact and high-torque synchronous motor in which a permanent magnet is embedded in a rotor is adopted, and vector control is generally used to maximize the torque of the synchronous motor.

In such vector control, a current command is calculated from a torque command generated by an accelerator command or a brake command and a speed, and a pulse width modulation (PWM) signal is generated on the basis of the current command to drive the power device of an inverter. Further, the vector control requires a current sensor for measuring the output current of the inverter. Therefore, in the vector control, a current sense element dedicated to current detection is provided separately from a main control element of an insulated gate bipolar transistor (IGBT) or metal-oxide-semiconductor field-effect transistor (MOS-FET) configuring the power device, and a current flowing through the current sense element is detected to estimate a main current flowing through the main control element. Such a power conversion circuit is well known, for example, as disclosed in PTL 1.

Meanwhile, the power device including the current sense element and the main control element described above has temperature dependency, and a current ratio of the sense element and the main control element vary depending on a chip temperature, and as a result, there is a problem that an accurate main control current cannot be calculated from a sense current. As a method for accurately observing the chip temperature at the same time while observing the sense current, it is known to form a temperature sensing diode on a semiconductor substrate configuring the power device and observe diode characteristics in a temperature measurement circuit (see, for example, PTL 2).

However, in a case where temperature measurement is performed by using a temperature sensing diode described in PTL 2 described above, an additional bonding pad for connecting the temperature sensing diode and the temperature measurement circuit is required on the semiconductor substrate. Therefore, in a case where the temperature measurement is performed by using the temperature sensing diode, there is a problem that the area of the semiconductor substrate increases accordingly and the product cost of the power device increases. Furthermore, since the temperature sensing diode described in PTL 2 requires a process for forming the temperature sensing diode or the like in the semiconductor substrate, there is also a problem that a manufacturing process becomes complicated and a manufacturing cost increases.

In this regard, as a method of observing the chip temperature without adding the bonding pad on the semiconductor substrate, there is a method of using a freewheeling diode connected with the IGBT in parallel and observing the terminal voltage of the freewheeling diode during a freewheeling mode (see, for example, PTL 3.).

Since the anode and the cathode of the freewheeling diode are connected to the emitter terminal and the collector terminal of the IGBT in a chip, respectively, an additional bonding pad is not required for the power device. Therefore, an increase in the chip size of the power device can be suppressed.

CITATION LIST

Patent Literature

PTL 1: JP 2006-271098 A
PTL 2: JP 2004-117111 A
PTL 3: JP 2015-228771 A

SUMMARY OF INVENTION

Technical Problem

However, in the above-described method of measuring the chip temperature by using the freewheeling diode described in PTL 3, it is necessary to prepare a special power device (IGBT) in which the freewheeling diode connected with the main control element in parallel is provided on the same chip, and the method cannot be applied in a case where a general freewheeling diode is provided on a separate chip from the IGBT and connected in parallel.

In addition, in a case where the power device is a MOSFET, a parasitic diode is formed by a body layer and a drift layer, but a current flows through the parasitic diode connected in parallel only during a dead time in which the MOSFET is in an off state in a freewheeling mode, and a period during which the chip temperature can be observed is limited to be short.

In this regard, an object of the present invention is to provide a power conversion device capable of observing a chip temperature of a power device with high accuracy and at low cost without providing the above-described restriction on a power device having a current sense element that observes a current flowing through a main control element and an observation time of a chip temperature and without increasing a chip cost.

Solution to Problem

In order to solve the above problem, for example, the configuration described in the claims is adopted.

The present application includes a plurality of means for solving the above-described problems. As an example, a power conversion device of the present invention includes: an insulated gate type first transistor that controls a main current; an insulated gate type second transistor that is formed on the same semiconductor substrate as the first transistor, is electrically connected with each of a drain and a gate of the first transistor in parallel, and detects a current of the first transistor; and a current measurement circuit that is connected between a source electrode of the second transistor and a source electrode of the first transistor to measure a current flowing through the second transistor after making a region of a source of the first transistor larger than a region of a source of the second transistor.

The power conversion device of the present invention includes: a diode that is formed on the semiconductor substrate and connected between the source electrode of the second transistor and the source electrode of the first transistor; and a temperature measurement circuit that is connected to the source electrode of the second transistor and measures a temperature of the semiconductor substrate by causing a predetermined forward current to flow through the diode when the first transistor is in an off state.

Advantageous Effects of Invention

According to the present invention, in the power conversion device in which the current sense element for current detection is mounted on the power device, the chip temperature can be observed with high accuracy and at low cost without increasing the number of bonding pads and the chip size of the power device.

Problems, configurations, and effects other than those described above will be clarified by the following description of embodiments.

DESCRIPTION OF EMBODIMENTS

First Embodiment

Hereinafter, a first embodiment of the present invention will be described with reference to FIGS. 1 to 5.

Figure 1:
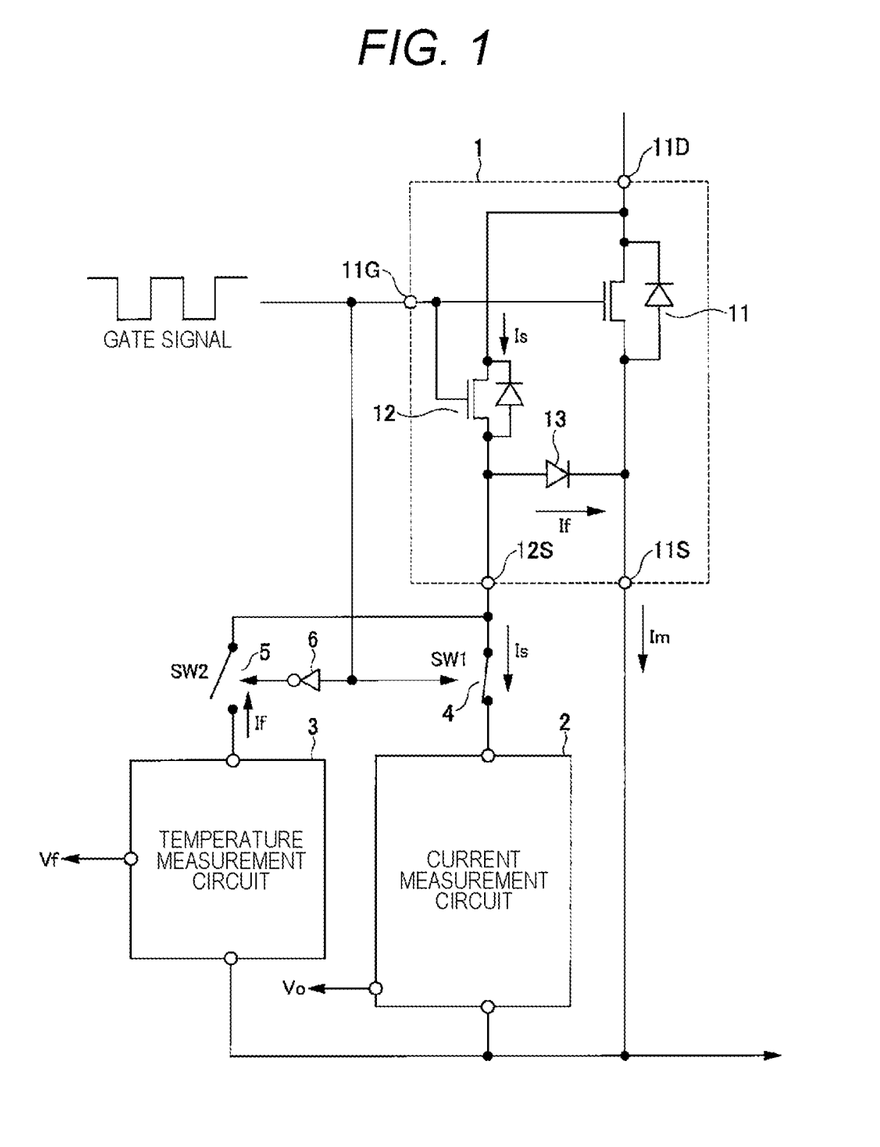
FIG. 1 is a circuit diagram of a power conversion device according to a first embodiment of the present invention.

FIG. 1 is a circuit diagram of a power conversion device according to the first embodiment.

A power device 1 includes a main control MOSFET 11, a current detection MOSFET 12, and a diode 13. The main control MOSFET 11 and the current detection MOSFET 12 are configured as an insulated gate type first transistor and an insulated gate type second transistor.

The drain and the gate of the current detection MOSFET 12 are electrically connected with a drain 11D and a gate 11G of the main control MOSFET 11 in parallel.

The diode 13 has an anode connected to a source 12S of the current detection MOSFET 12 and a cathode connected to a source 11S of the main control MOSFET 11.

The current detection MOSFET 12 is connected with a current measurement circuit 2 via a first switch 4 and connected with a temperature measurement circuit 3 via a second switch 5. Note that the first and second switches 4 and 5 are also denoted as SW1 and SW2 in the drawings.

On/off of the first and second switches 4 and 5 is controlled by the gate signals of the main control MOSFET 11 and the current detection MOSFET 12. When the gate signal is in a high state (high-voltage state), the first switch 4 is turned on, and the current measurement circuit 2 is connected to the current detection MOSFET 12. At this time, the second switch 5 is turned off.

When the gate signal is in a low state (low-voltage state), the second switch 5 is turned on by an inverter 6, and the temperature measurement circuit 3 is connected to the current detection MOSFET 12. At this time, the first switch 4 is turned off.

With this configuration, in a current detection mode in which both the main control MOSFET 11 and the current detection MOSFET 12 are in the on state, the current measurement circuit 2 measures the sense current ($I_s$) flowing through the current detection MOSFET 12 and outputs a voltage ($V_o$) proportional to the sense current ($I_s$).

On the other hand, in a temperature detection mode in which both the main control MOSFET 11 and the current detection MOSFET 12 are in the off state, the temperature measurement circuit 3 causes a desired forward current ($I_f$) to flow through the diode 13, and detects and outputs a voltage ($V_f$) of an anode terminal of the diode 13 in the temperature measurement circuit 3.

Figure 2:
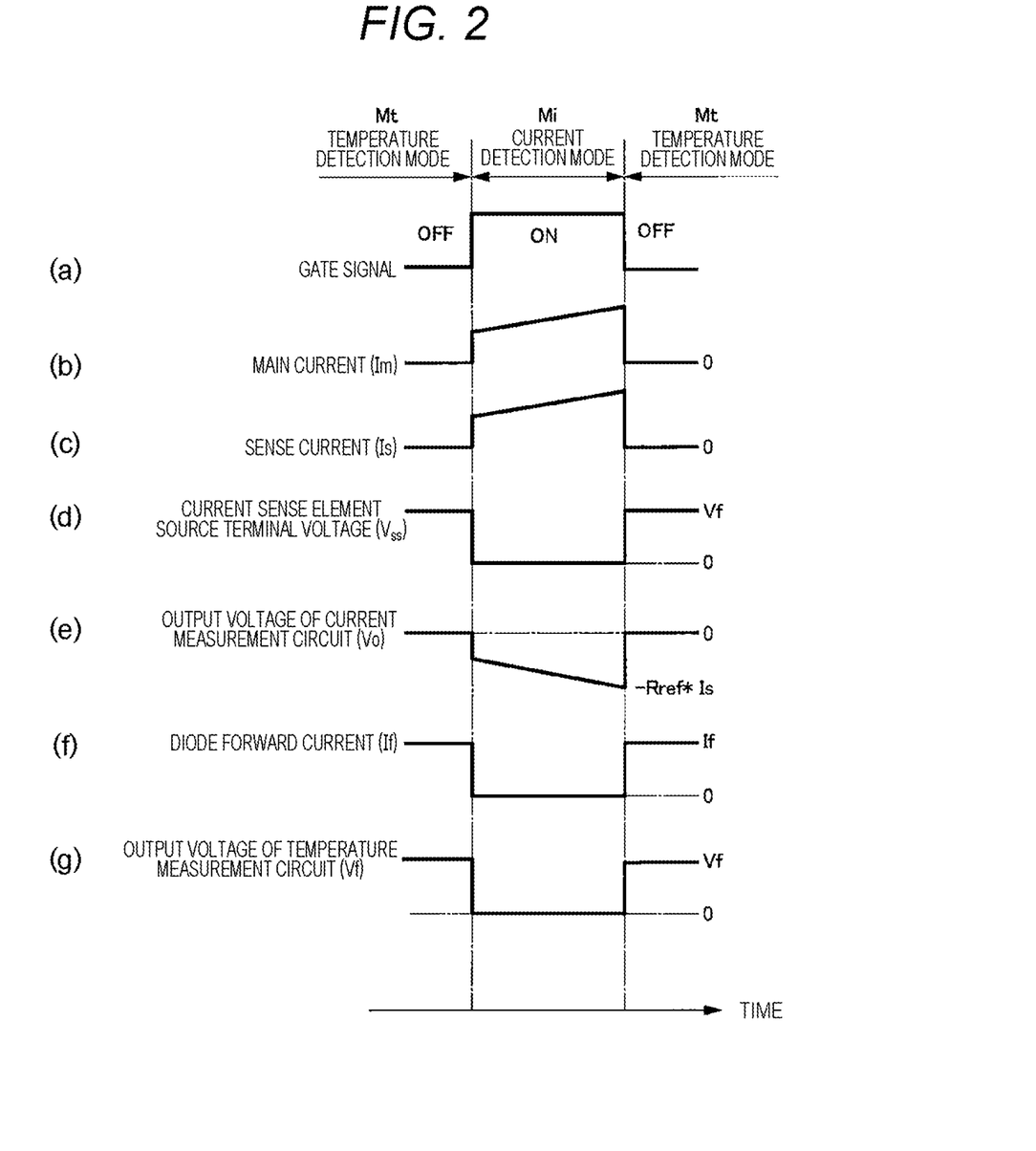
FIG. 2 is a waveform diagram for explaining operations in a temperature detection mode and a current detection mode according to the first embodiment of the present invention.

FIG. 2 is a waveform diagram illustrating an operation example in a current detection mode Mi and a temperature detection mode Mt in the circuit illustrated in FIG. 1.

The current detection mode Mi and the temperature detection mode Mt are switched by the gate signal illustrated in FIG. 2(a). That is, when the gate signal is in the high state, and both the main control MOSFET 11 and the current detection MOSFET 12 are in the on state, the mode becomes the current detection mode Mi. When the gate signal is in the low state and both the main control MOSFET 11 and the current detection MOSFET 12 are in the off state, the mode becomes the temperature detection mode Mt.

In the current detection mode Mi, the main current ($I_m$) (FIG. 2(b)) is generated in the on state of the main control MOSFET 11, and the current measurement circuit 2 measures the sense current ($I_s$) (FIG. 2(c)) flowing through the current detection MOSFET 12. Then, the current measurement circuit 2 outputs a voltage ($V_o$) (FIG. 2(e)) proportional to the sense current ($I_s$) in this measurement. Note that a voltage ($V_{ss}$) of the source 12S of the current detection MOSFET 12 is 0 V in the current detection mode Mi as illustrated in FIG. 2(d).

In the temperature detection mode Mt, the temperature measurement circuit 3 causes a desired forward current ($I_f$) (FIG. 2(f)) to flow through the diode 13, and the voltage ($V_f$) (FIG. 2(g)) of the anode terminal of the diode 13 is detected and output by the voltage detection circuit in the temperature measurement circuit 3.

The output voltage ($V_f$) of the temperature measurement circuit 3 can be expressed by a [Mathematical Formula 1] obtained by modifying the Shockley diode equation between the output voltage ($V_f$) and the chip temperature (T) of the vicinity of the diode 13.

[Mathematical Formula 1]

$$V_f = \frac{kT}{q}\text{Ln}\left(\frac{I_f}{I_0}\right)$$

Here, $I_0$ represents a reverse saturation current of the diode 13, k represents a Boltzmann constant, and q represents a charge amount of electrons.

Figure 3:
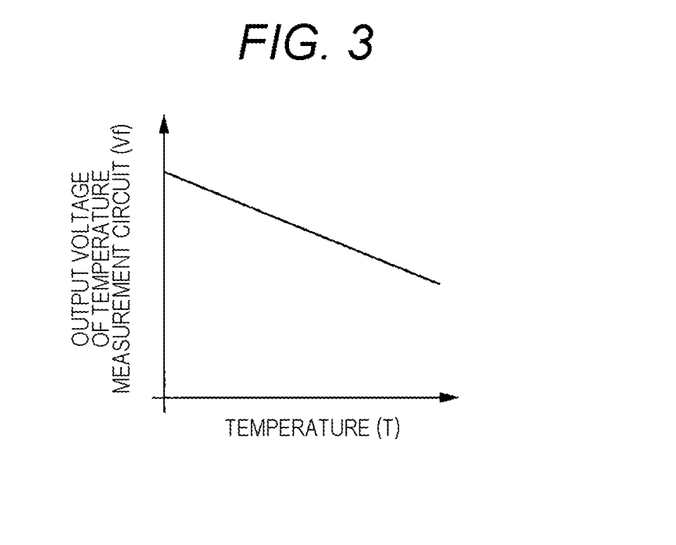
FIG. 3 is a characteristic diagram illustrating a relationship between a chip temperature on which a power device according to the first embodiment of the present invention is mounted and an output voltage ($V_f$) of a temperature measurement circuit.

FIG. 3 is a characteristic diagram illustrating a relationship between the output voltage ($V_f$) (vertical axis) and the chip temperature (T) (horizontal axis).

As illustrated in FIG. 3, the output voltage ($V_f$) and the chip temperature (T) can be linearly approximated, and the amount of change with respect to the temperature varies depending on the current amount ($I_f$), and is generally a value of about 2.0 to 3.5 mV/° C.

By causing a desired constant current ($I_f$) to flow through the diode 13, the output voltage ($V_f$) linearly changes with respect to the chip temperature (T). Therefore, when a characteristic test is performed in advance and the output voltage ($V_f$) and the chip temperature (T) are measured at two temperatures, the characteristic as illustrated in FIG. 3 for obtaining the output voltage ($V_f$) and the chip temperature (T) can be acquired. Then, by using the characteristic illustrated in FIG. 3, the chip temperature (T) can be measured by temperature calibration processing by a relatively simple test.

Therefore, in the power conversion device according to the present embodiment, it is possible to realize highly accurate chip temperature measurement while suppressing the test cost of the power conversion device.

In the power conversion device of the present embodiment, an on/off state occurs during one cycle by PWM control of the main control MOSFET 11. For example, in the case of PWM control with a frequency of 20 kHz, the on/off state occurs during 50 µs. Therefore, the power conversion device of the present embodiment can measure the sense current ($I_s$) and the chip temperature (T) in a sufficiently short period with respect to the change time of the chip temperature.

Figure 4:
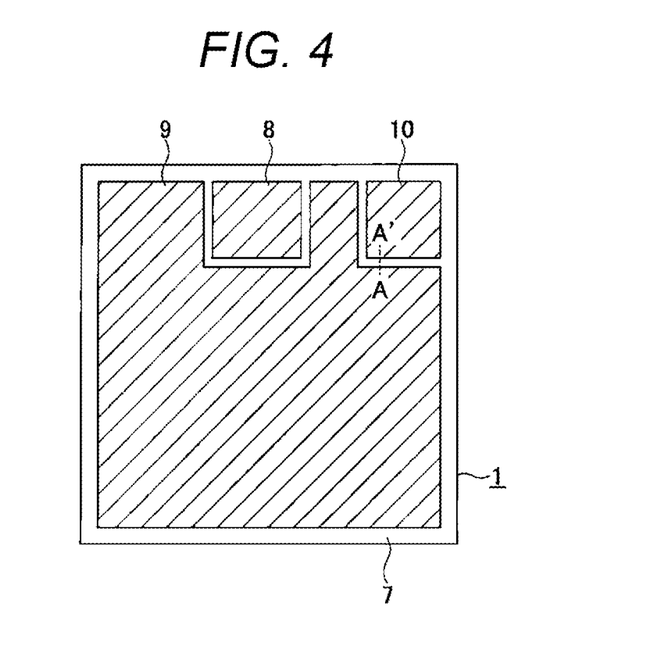
FIG. 4 is a plan external view of a chip on which the power device according to the first embodiment of the present invention is mounted.
Figure 5:
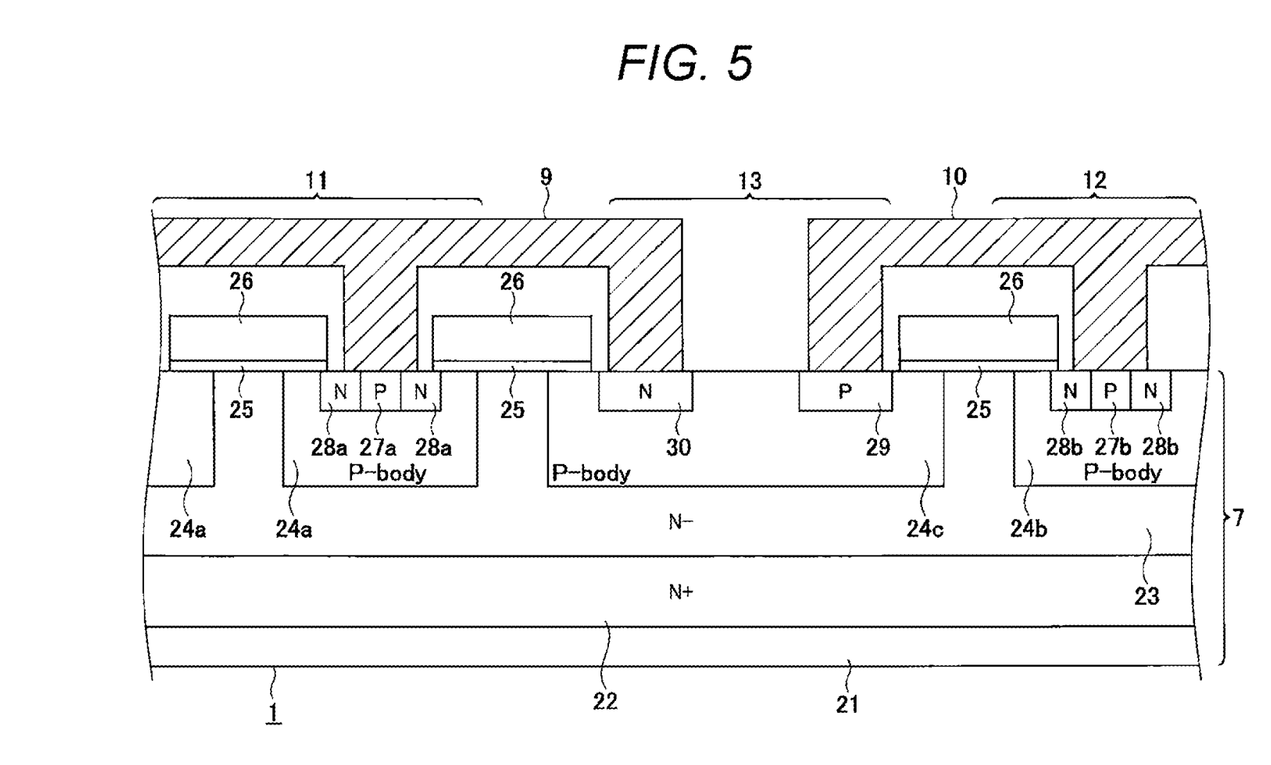
FIG. 5 is a cross-sectional structural diagram of a broken line A-A' of the chip on which the power device according to the first embodiment of the present invention is mounted.

FIG. 4 is a plan external view of the power device 1 included in the power conversion device of the present embodiment, and FIG. 5 is a cross-sectional structural view taken along a broken line A-A' in FIG. 4.

As illustrated in a cross section in FIG. 5, the main control MOSFET 11, the current detection MOSFET 12, and the diode 13 are formed on a semiconductor substrate 7.

In the power device 1 illustrated in FIG. 5, a drain electrode 21, a drain 22, and a drift layer 23 are formed in order from the lower layer, and P body layers 24a, 24b, and 24c are formed on the drift layer 23. Then, a gate 26 is formed across a plurality of P body layers 24a, 24b, and 24c via a gate oxide film 25.

The cathode 30 of the diode 13 is connected to a source 27a of the main control MOSFET 11 via an electrode pad 9. In addition, an anode 29 of the diode 13 is connected to a source 27b of the current detection MOSFET 12 via a source electrode pad 10.

The cathode 30 of the diode 13 is formed in the same layer as a source 28a of the main control MOSFET 11 and a source 28b of the current detection MOSFET 12.

In addition, the anode 29 of the diode 13 is formed in the same layer as a P-body connection layer 27a of the main control MOSFET 11 and a P-body connection layer 27b of the current detection MOSFET 12.

That is, the region of the cathode 30 of the diode 13 is formed of a first conductivity type impurity layer that forms the source (or emitter) of the main control MOSFET 11. The region of the anode 29 of the diode 13 is formed of a second conductivity type impurity layer that forms the P-body region or the P-body region connection region of the current detection MOSFET 12.

With such a configuration, in manufacturing the power device 1, an additional manufacturing process for forming the diode 13 is unnecessary, and the power device 1 of the present embodiment does not increase the manufacturing cost as compared with the conventional power device.

As illustrated in FIG. 4, three bonding pads on the surface of the power device 1 are a gate electrode (first bonding pad) 8, the source electrode pad (second bonding pad) 9 of the main control MOSFET 11, and the source electrode pad (third bonding pad) 10 of the current detection MOSFET 12. Therefore, since there is no increase in the number of electrode pads due to the addition of the diode 13, the chip size does not increase.

Note that in the configuration illustrated in FIG. 1, the power device 1 is configured by MOSFETs, but the power device 1 may be configured by connecting a diode between emitter terminals of IGBTs having current sense elements.

Second Embodiment

Figure 6:
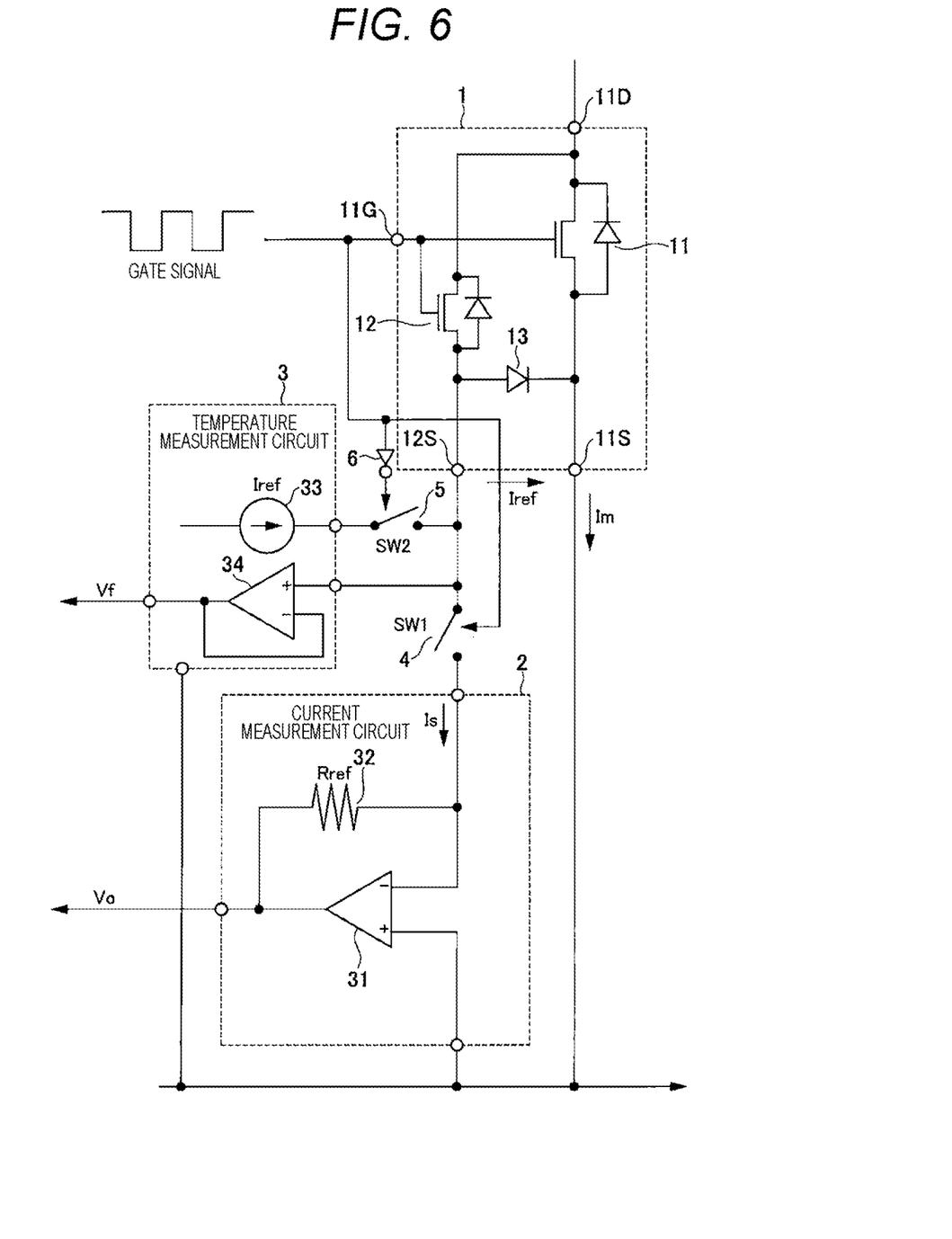
FIG. 6 is a circuit diagram of a power conversion device according to a second embodiment of the present invention.

Next, a second embodiment of the present invention will be described with reference to FIG. 6. In FIG. 6, portions corresponding to those in FIGS. 1 to 5 described in the first embodiment are denoted by the same reference numerals, and redundant description is omitted.

FIG. 6 is a circuit diagram of a power conversion device according to the second embodiment.

The present embodiment illustrates specific circuit configurations of the current measurement circuit 2 and the temperature measurement circuit 3 in the first embodiment.

The current measurement circuit 2 is configured by an operational amplifier 31 and a current-voltage conversion circuit including a parallel resistor 32 connected between a negative input terminal (−) and an output terminal of the operational amplifier 31. A positive input terminal of the operational amplifier 31 is connected to the source of the main control MOSFET 11.

The current measurement circuit 2 is connected to the source 12S of the current detection MOSFET 12 via the first switch 4.

When the first switch 4 is brought into a conductive state in the current detection mode, the source potential of the current detection MOSFET 12 is the same as the source potential of the main control MOSFET 11, and thus no current flows through the diode 13. In addition, the gate-source voltage of the current detection MOSFET 12 can be made equal to the gate-source voltage of the main control MOSFET 11, and a change in a ratio (current sense ratio) of the main control MOSFET to the main current ($I_m$) and the sense current ($I_s$) can be reduced.

The temperature measurement circuit 3 includes a constant current source 33 that causes a desired current to flow through the diode 13, and a voltage detection circuit including an operational amplifier 34 in which a negative input terminal (−) and an output terminal are connected. The constant current source 33 is connected to the source 12S of the current detection MOSFET 12 via the second switch 5. The positive input terminal (+) of the operational amplifier 34 is directly connected to the source 12S of the current detection MOSFET 12, and the operational amplifier 34 detects and outputs an anode potential ($V_f$) of the diode 13 in the temperature detection mode.

With such a configuration, the temperature measurement circuit 3 can detect the anode potential ($V_f$) of the diode 13. Then, the temperature measurement circuit 3 can calculate the chip temperature from the output value ($V_f$) by using relational data, which is acquired in advance at the time of test of the power conversion device, between the output potential ($V_f$) and the chip temperature (T).

Third Embodiment

Figure 7:
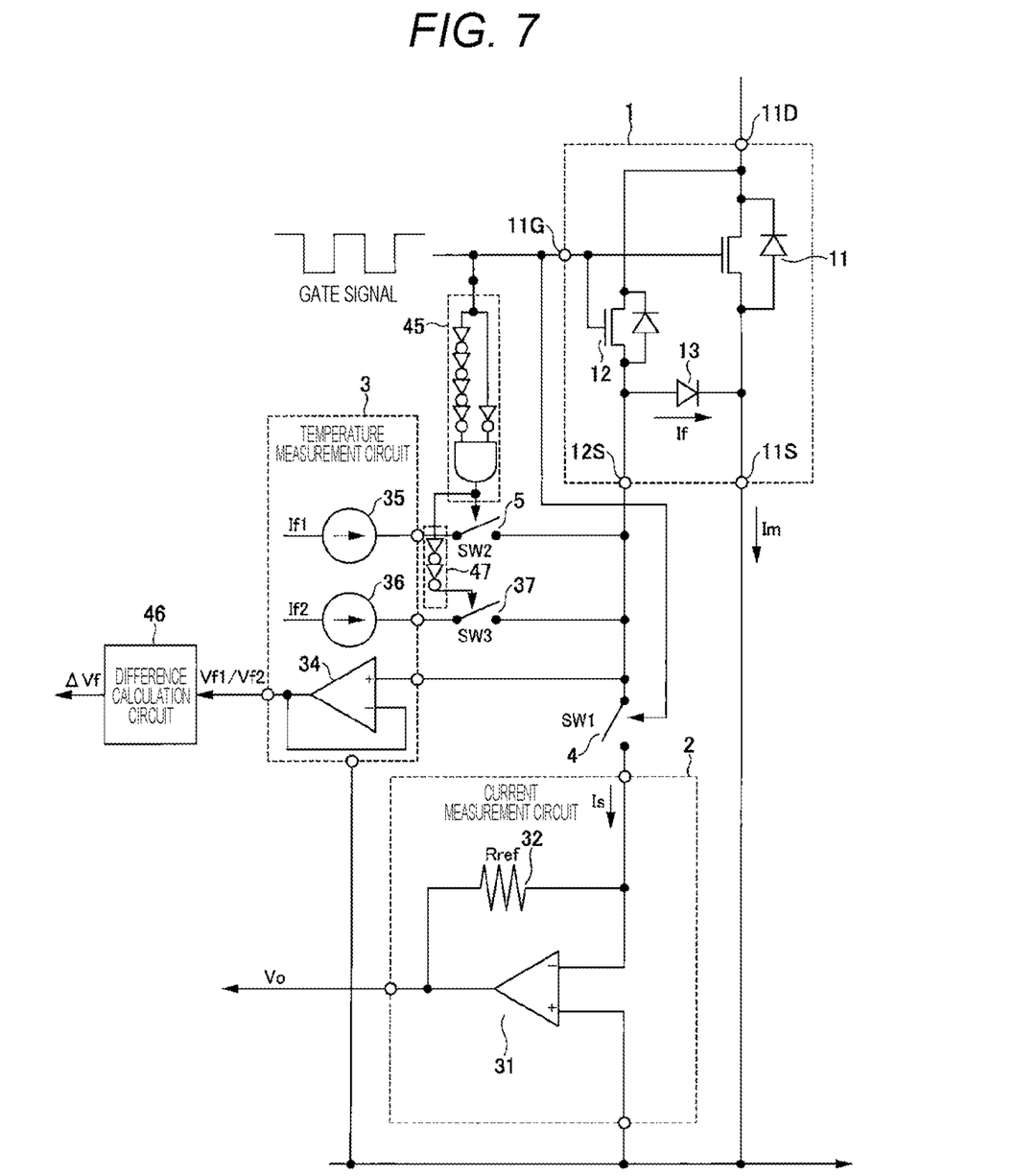
FIG. 7 is a circuit diagram of a power conversion device according to a third embodiment of the present invention.
Figure 8:
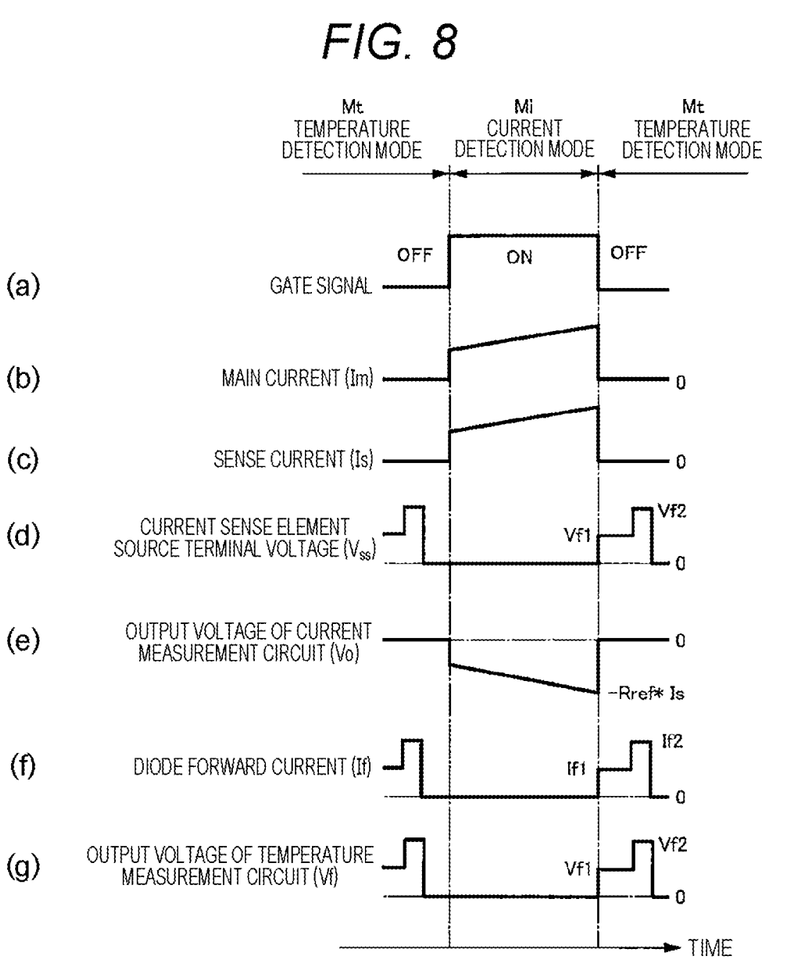
FIG. 8 is a waveform diagram for explaining operations in a temperature detection mode and a current detection mode according to the third embodiment of the present invention.
Figure 9:
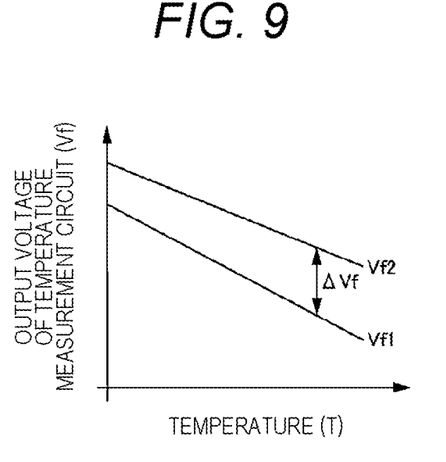
FIG. 9 is a characteristic diagram illustrating a relationship between a chip temperature (T) of a power device and an output voltage ($V_{f1}$, $V_{f2}$) of a temperature measurement circuit according to the third embodiment of the present invention.

Next, a third embodiment of the present invention will be described with reference to FIGS. 7 to 9. In FIGS. 7 to 9, portions corresponding to those in FIGS. 1 to 6 described in the first and second embodiments are denoted by the same reference numerals, and redundant description is omitted.

FIG. 7 is a circuit diagram of a power conversion device according to the third embodiment.

In the present embodiment, the temperature measurement circuit 3 includes first and second constant current sources 35 and 36. In addition, a difference calculation circuit 46 is connected to the output side of the temperature measurement circuit 3, and the difference calculation circuit 46 measures a temperature from the output thereof.

The first constant current source 35 is connected to the source 12S of the current detection sense element 12 via the second switch 5. When the second switch 5 is in the on state, the first constant current source 35 causes a desired current ($I_{f1}$) to flow through the diode 13 connected to the source 12S of the current detection sense element 12.

The second constant current source 36 is connected to the source 12S of the current detection sense element 12 via a third switch 37. When the third switch 37 is in the on state, the second constant current source 36 causes a desired current ($I_{f2}$) to flow through the diode 13 connected to the source 12S of the current detection sense element 12. The current ($I_{f2}$) by the second constant current source 36 is a current value different from the current ($I_{f1}$) by the first constant current source 35. Note that the third switch 37 is denoted as SW3 in the drawings.

The second switch 5 and the third switch 37 are turned on in different periods. That is, an inversion delay circuit 45 is connected between the control terminal and the gate signal terminal of the second switch 5, and after the gate signal is changed from the on state to the off state, the second switch 5 is brought into the conductive state only for a certain period. Further, the output of the inversion delay circuit 45 is delayed by a delay circuit 47 and supplied to the control terminal of the third switch 37, and after the second switch 5 is turned off, the third switch 37 is brought into a conductive state only for a certain period.

FIG. 8 is a waveform diagram illustrating an operation example in the current detection mode Mi and the temperature detection mode Mt in the circuit illustrated in FIG. 7. Since the operation in the current detection mode Mi is the same as the operation illustrated in FIG. 2, the description thereof will be omitted.

Then, in the temperature detection mode Mt, when the gate signal (FIG. 8(*a*)) is turned off, first, the second switch 5 is brought into a conductive state only for a certain period. At this time, the desired current ($I_{f1}$) flows through the diode 13 by the first constant current source 35 (FIG. 8(*f*)). In addition, at this time, the source terminal voltage (Vss) of the current detection sense element 12 becomes the anode voltage ($V_{f1}$) of the diode 13 as illustrated in FIG. 8(*g*).

After the second switch 5 is turned off, the third switch 37 is brought into a conductive state only for a certain period of time. At this time, the desired current ($I_{f2}$) flows through the diode 13 by the second constant current source 36 (FIG. 8(*f*)). At this time, the source terminal voltage (Vss) of the current detection sense element 12 becomes the anode voltage ($V_{f2}$) of the diode 13 as illustrated in FIG. 8(*g*).

Then, in the difference calculation circuit 46 to which the output of the temperature measurement circuit 3 is supplied, a differential voltage ($\Delta V_f$) between the two anode voltage values $V_{f1}$ and $V_{f2}$ input at a time difference is calculated. In the power conversion device of the present embodiment, the differential voltage ($\Delta V_f$) is used as a measured value corresponding to the temperature.

FIG. 9 is a characteristic diagram in which the output voltages $V_{f1}$ and $V_{f2}$ and the differential voltage thereof when the two different forward currents $I_{f1}$ and $I_{f2}$ are caused to flow through the diode 13 are set on a vertical axis, and the chip temperature (T) is set on a horizontal axis.

Here, the anode voltage values $V_{f1}$ and $V_{f2}$ and the differential voltage ($\Delta V_f$) are given by the following [Mathematical Formula 2], [Mathematical Formula 3], and [Mathematical Formula 4], respectively.

[Mathematical Formula 2]

$$V_{f1} = \frac{kT}{q}\text{Ln}\left(\frac{I_{f1}}{I_0}\right)$$

[Mathematical Formula 3]

$$V_{f2} = \frac{kT}{q}\text{Ln}\left(\frac{I_{f2}}{I_0}\right)$$

[Mathematical Formula 4]

$$\Delta V_f = V_{f2} - V_{f1} = \frac{kT}{q}L_n\left(\frac{I_{f2}}{I_{f1}}\right)$$

Here, $I_0$ represents a reverse saturation current of the diode 13, k represents a Boltzmann constant, and q represents a charge amount of electrons.

The reverse saturation current $I_0$ of the diode 13 is a parameter having an individual difference at the time of manufacturing the diode 13, but is not included in [Mathematical Formula 4] of the differential voltage ($\Delta V_f$). Therefore, when the differential voltage ($\Delta V_f$) is used as the measured value of the temperature, variations in characteristics due to the individual difference are eliminated, and $I_{f2}/I_{f1}$ becomes a ratio of the desired forward current and thus becomes a fixed value.

That is, the differential voltage ($\Delta V_f$) is a value obtained by multiplying the chip temperature (T) by the fixed value. This eliminates the need for the temperature calibration test at the time of the test for acquiring the correlation data between the output voltage ($V_f$) of the temperature measurement circuit 3 and the chip temperature (T) described in the first embodiment, thereby reducing the cost required for executing the test.

Fourth Embodiment

Figure 10:
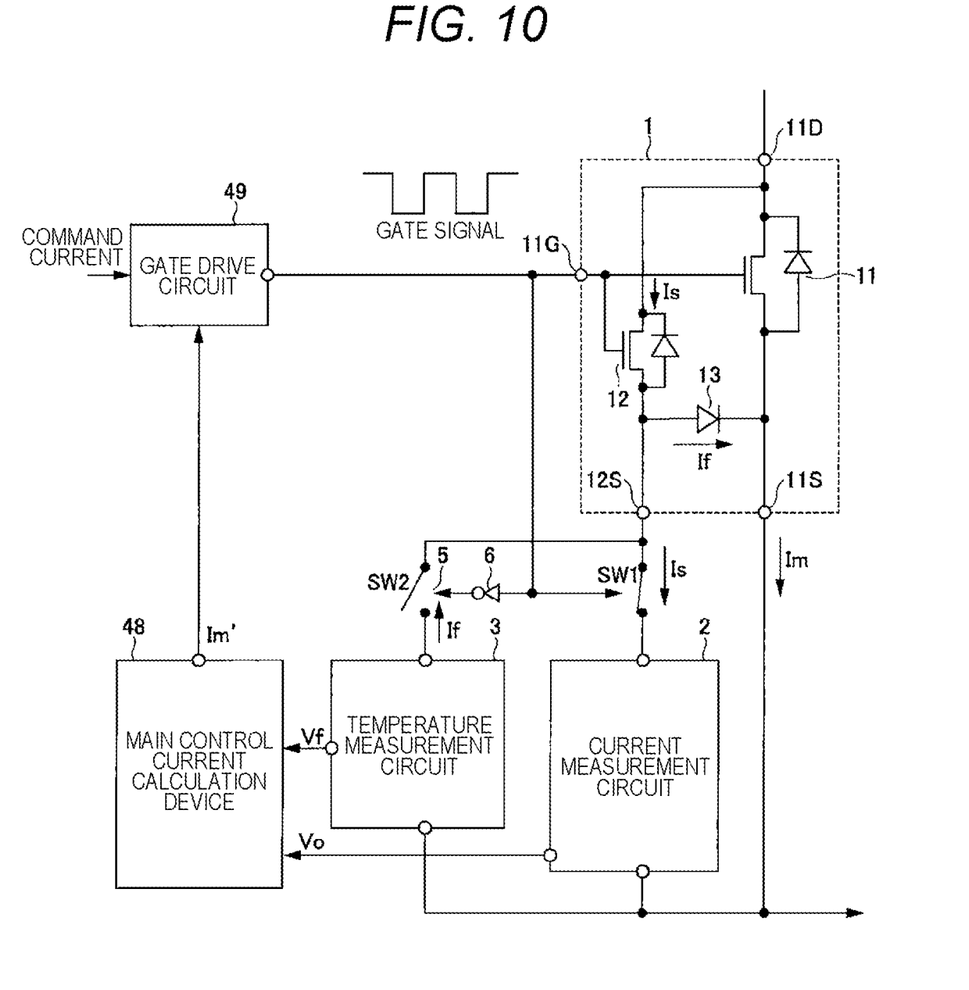
FIG. 10 is a circuit diagram of a power conversion device according to a fourth embodiment of the present invention.
Figure 11:
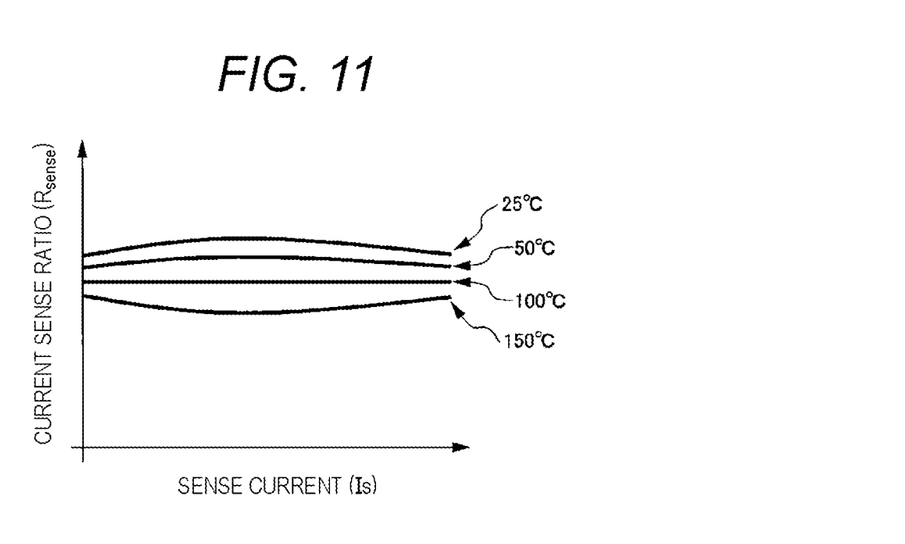
FIG. 11 is a diagram illustrating a correlation between a sense current ($I_s$) and a chip temperature (T) in a current detection MOSFET having a current sense ratio according to the fourth embodiment of the present invention.
Figure 12:
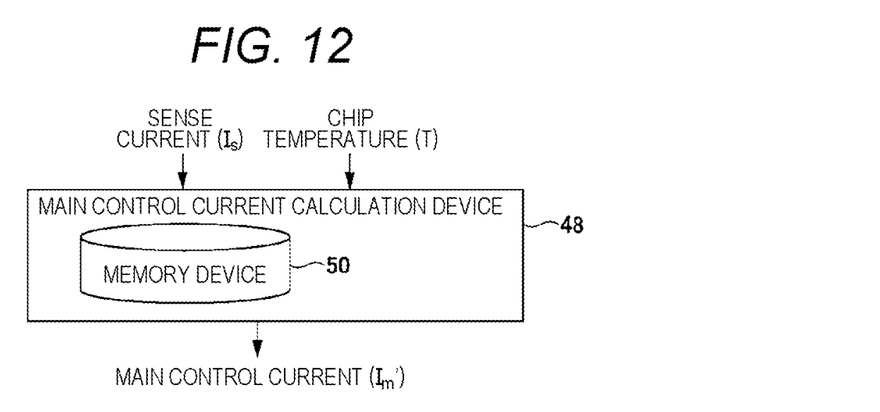
FIG. 12 is a configuration diagram of the power conversion device mounted with a main control current calculation device that calculates a main control current ($I_m$') by using information, which is stored in a memory device, on the correlation between the sense current ($I_s$) and the chip temperature (T) in the current detection MOSFET having the current sense ratio according to the fourth embodiment of the present invention.

Next, a fourth embodiment of the present invention will be described with reference to FIGS. 10 to 12. In FIGS. 10 to 12, portions corresponding to those in FIGS. 1 to 9 described in the first to third embodiments are denoted by the same reference numerals, and redundant description is omitted.

FIG. 10 is a circuit diagram of a power conversion device according to the fourth embodiment.

In the present embodiment, there are provided a main control current calculation device 48 to which the outputs of current measurement circuit 2 and temperature measurement circuit 3 described in the first embodiment are supplied, and a gate drive circuit 49 that generates a gate signal by the main control current calculation device 48.

The main control current calculation device 48 calculates a main control current ($I_m'$) of the main control MOSFET 12 by using the sense current ($I_s$) of the current detection MOSFET 11 obtained from the output voltage ($V_o$) of the current measurement circuit 2 and the value of the chip temperature (T) obtained from the output ($V_f$) of the temperature measurement circuit 3.

The main control current ($I_m'$) calculated by the main control current calculation device 48 is supplied to the gate drive circuit 49, and the gate drive circuit 49 generates the gate signal of the main control MOSFET 11 on the basis of a command current and the main control current ($I_m'$).

FIG. 11 illustrates an example of a ratio (current sense ratio $R_{sense}$) (vertical axis) between the main control current ($I_m$) of the main control MOSFET and the sense current ($I_s$) with respect to the sense current ($I_s$) (horizontal axis) used to calculate the main control current ($I_m'$).

As illustrated in FIG. 11, it can be seen that the current sense ratio $R_{sense}$ to the sense current ($I_s$) changes depending on the chip temperature (T), that is, has temperature dependency.

Therefore, as illustrated in FIG. 12, the main control current calculation device 48 incorporates the memory device 50, acquires correlation data among the sense current ($I_s$), the current sense ratio ($R_{sense}$), and the chip temperature (T) in advance at the time of the test of the power conversion device, and stores the correlation data in the memory device 50.

The main control current calculation device 48 measures the sense current ($I_s$) and the chip temperature (T) for each switching of the main control MOSFET during the actual operation of the power conversion device, and obtains the value of the current sense ratio ($R_{sense}$) at the observed sense current ($I_s$) and chip temperature (T) from the memory device 50. The main control current ($I_m'$) is calculated by multiplying the sense current ($I_s$) by the current sense ratio ($R_{sense}$). Then, the calculated main control current ($I_m'$) is compared with the command current, and the gate signal is adjusted through the gate drive circuit 49 such that the difference therebetween becomes small.

The main control current calculation device 48 can calculate the main control current ($I_m'$) in real time with high accuracy by correcting the above-described current sense ratio by using the chip temperature (T) information obtained in a PWM control cycle. Therefore, according to the configuration of the present embodiment, the main control current calculation device 48 can be used as a measurement instrument of a load drive current for controlling the power conversion device.

<Example of Inverter Device Incorporating Power Conversion Device of Each Embodiment>

Figure 13:
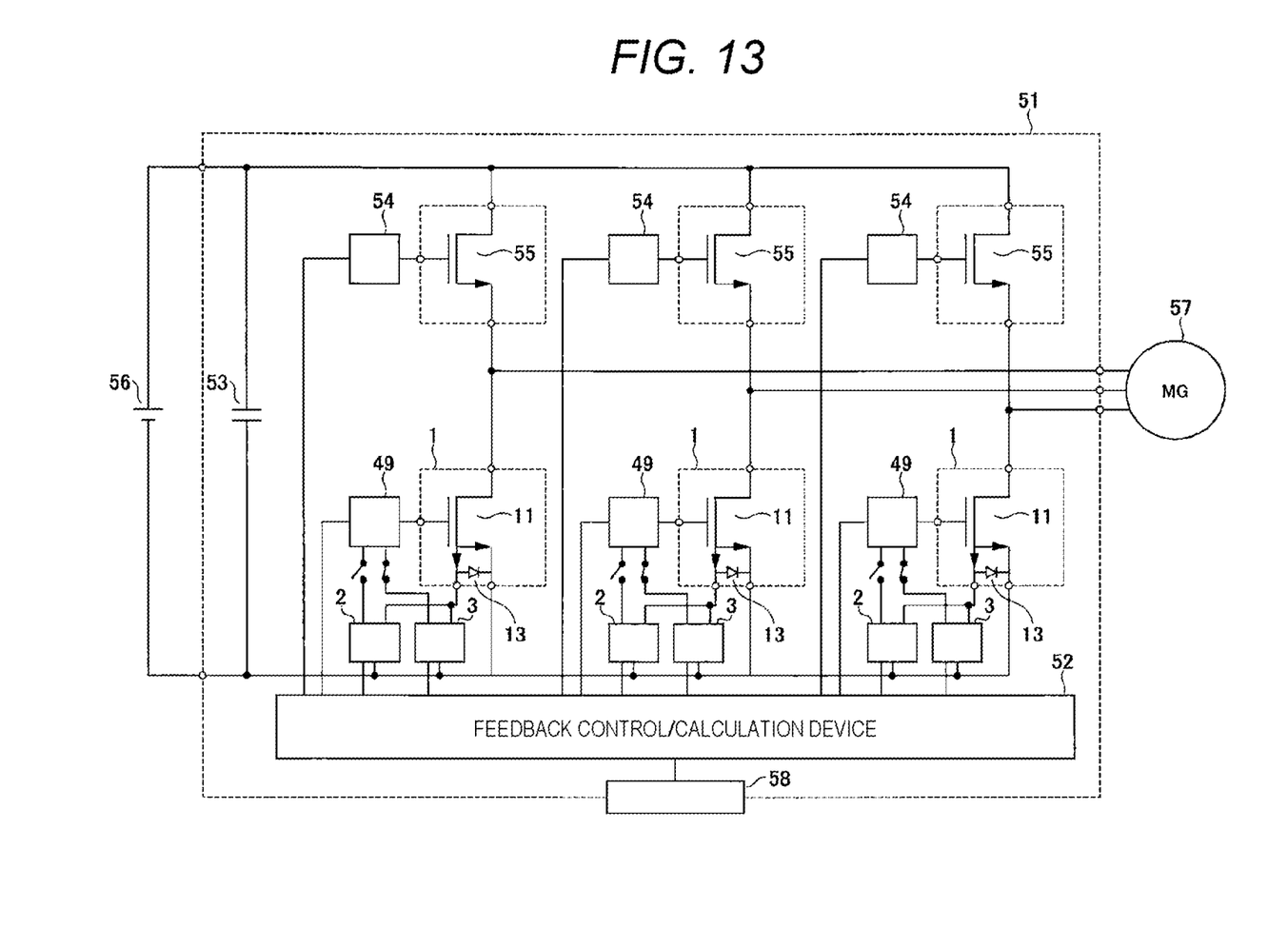
FIG. 13 is a configuration diagram of a three-phase inverter device incorporating the power conversion device according to each embodiment of the present invention.

FIG. 13 illustrates a configuration of a three-phase inverter device including the power conversion device of each embodiment described so far. In the example of FIG. 13, an example in which the power conversion device of the first embodiment is incorporated is illustrated, but an inverter device may be configured by incorporating the power conversion device of another embodiment.

A three-phase inverter device 51 illustrated in FIG. 13 is a device that drives a load motor 57 by PWM control, and a power supply 56 is supplied to the three-phase inverter device 51. A capacitor 53 is connected between the high voltage side and the low voltage side of the power supply 56.

The three-phase inverter device 51 includes separate main control MOSFETs on a hish-side side (high pressure side) and a low-side (low pressure side) for each of three phases.

That is, each phase includes a hish-side main control MOSFET 55 and a low-side main control MOSFET 11. The low-side main control MOSFET 11 corresponds to the main control MOSFET 11 described in the power conversion device of each embodiment.

Then, the low-side main control MOSFET 11 of each phase is controlled by a gate signal output from the gate drive circuit 49 individually provided in each phase.

Here, the gate drive is controlled on the basis of the sense current ($I_s$) measured by the current measurement circuit 2 and the output voltage ($V_f$) measured by the temperature measurement circuit 3 as described in each embodiment. The output value of the current measurement circuit 2 is calculated, by a control/calculation device 52 including the main control current calculation device 48 (FIG. 10), as a main current when the main control MOSFET 11 on the low side is in the on state.

An instruction current for driving the load motor 57 is supplied from the outside to the control/calculation device 52 through the communication connector 58, and the gate drive circuit 49 is feedback-controlled so as to reduce a difference from the instruction current. Then, in the inverter device 51 that is PWM-controlled, the low-side main control MOSFETs of all three phases are simultaneously turned on within one cycle. Therefore, the control/calculation device 52 can perform feedback control in which the current flowing through the load motor 57 is observed in real time.

Also for the gate drive circuit 49 that supplies a gate signal to the low-side main control MOSFET 11, the control/calculation device 52 performs feedback control.

<Modification>

Note that the present invention is not limited to the above-described embodiments, and includes various modifications. For example, the above-described embodiments have been described in detail in order to describe the present invention in an easily understandable manner, and are not necessarily limited to those having all the described configurations.

For example, in the three-phase inverter device 51 illustrated in FIG. 13, an example in which the configuration of the power conversion device described in each embodiment is applied to the low-side main control MOSFET 11 is illustrated. However, the configuration of the power conversion device described in each embodiment may also be applied to the hish-side main control MOSFET 55.

In addition, as described in the first embodiment, the power device 1 may have a configuration in which a diode is connected between the emitter terminals of the IGBTs having the current sense elements.

In the circuit diagram of FIG. 1 or the like, only the signal lines and the control lines considered to be necessary for the description are illustrated, and not all the control lines and the information lines on the product are necessarily illustrated. It may be considered that almost all the components are connected to each other in actual.

REFERENCE SIGNS LIST 1 power device
2 current measurement circuit
3 temperature measurement circuit
4 first switch (SW1)
5 second switch (SW2)
6 inverter
7 semiconductor substrate
8 gate electrode bud
9 main control element source electrode pad
10 sense element source electrode pad
11 main control MOSFET
12 current detection MOSFET
13 temperature detection diode
21 drain electrode
22 drain
23 drift layer
24a, 24b, 24c P body layer
25 gate oxide film
26 gate
27a, 27b P body layer connection P layer
28a, 28b source
29 anode
30 cathode
31 operational amplifier
32 parallel resistor
37 third switch (SW3)
45 delay inversion circuit
46 difference calculation circuit
47 delay circuit
48 main control current calculation device
49 gate drive circuit
50 memory device
51 three-phase inverter device
52 feedback control/calculation device
53 capacitor
54 gate drive circuit
55 high-side main control MOSFET
56 power supply
57 load motor
58 communication connector

The invention claimed is:

1. A power conversion device comprising:
an insulated gate type first transistor that controls a main current;
an insulated gate type second transistor that is formed on a same semiconductor substrate as the first transistor, is electrically connected with each of a drain and a gate of the first transistor in parallel, and detects a current of the first transistor;
a current measurement circuit that is connected between a source electrode of the second transistor and a source electrode of the first transistor to measure a current flowing through the second transistor, wherein a region of a source of the first transistor larger than a region of a source of the second transistor;
a diode that is formed on the semiconductor substrate and connected between the source electrode of the second transistor and the source electrode of the first transistor; and
a temperature measurement circuit that is connected to the source electrode of the second transistor and measures a temperature of the semiconductor substrate by causing a predetermined forward current to flow through the diode when the first transistor is in an off state, wherein
a bonding pad formed on the semiconductor substrate on which the first transistor, the second transistor, and the diode are mounted comprises:
a first bonding pad to which a source or emitter electrode of the first transistor and a cathode electrode of the diode are connected,
a second bonding pad to which a source or emitter electrode of the second transistor and an anode electrode of the diode are connected, and
a third bonding pad to which gate electrodes of the first and second transistors are connected
the temperature measurement circuit comprises a constant current source that causes the forward current to flow and a voltage measurement circuit that measures a source potential of the second transistor,
when the first transistor is in the off state, the constant current source causes a first current value to flow to the diode and then causes a second current value to flow to the diode, and
the voltage measurement circuit detects a source potential of the second transistor during flow of the first current value and a source voltage of the second transistor during flow of the second current value, calculates a difference value between the source potential and the source voltage, and calculates a temperature of the semiconductor substrate from the difference value.

2. The power conversion device according to claim 1, wherein
a cathode region of the diode is formed of a first conductivity type impurity layer forming a source region or an emitter region of the first transistor, and
an anode region of the diode is formed of a second conductivity type impurity layer forming a P-body region or a P-body region connection region of the second transistor.

3. The power conversion device according to claim 1, wherein
the current measurement circuit and the temperature measurement circuit execute a current detection mode and a temperature detection mode in response to a gate signal for controlling the first transistor,
in the current detection mode in which the gate signal is in an on state, the current measurement circuit observes a sense current flowing through the second transistor,
in the temperature detection mode in which the gate signal is in an off state, the temperature measurement circuit calculates a temperature of the semiconductor substrate on a basis of a terminal voltage of the diode, and a main control current calculation device that calculates a main current flowing through the first transistor from the sense current and the temperature is connected to the current measurement circuit and the temperature measurement circuit.

4. The power conversion device according to claim 3, wherein
the power conversion device is configured as an inverter device provided at least on a low voltage side, and
a control/calculation device that controls a gate drive circuit of a main control transistor calculates the main current flowing through the first transistor and performs feedback control on the gate drive circuit to match a command current for driving a load.

5. The power conversion device according to claim 1, wherein
the current measurement circuit comprises:
an operational amplifier having a negative input terminal connected to the source electrode of the second transistor and a positive input terminal connected to the source electrode of the first transistor, and
a resistance element connected to the negative input terminal and an output terminal of the operational amplifier.

6. A power conversion device comprising:
an insulated gate type first transistor that controls a main current;
an insulated gate type second transistor that is formed on a same semiconductor substrate as the first transistor, is electrically connected with each of a drain and a gate of the first transistor in parallel, and detects a current of the first transistor;
a current measurement circuit that is connected between a source electrode of the second transistor and a source electrode of the first transistor to measure a current flowing through the second transistor, wherein a region of a source of the first transistor larger than a region of a source of the second transistor;
a diode that is formed on the semiconductor substrate and connected between the source electrode of the second transistor and the source electrode of the first transistor; and
a temperature measurement circuit that is connected to the source electrode of the second transistor and measures a temperature of the semiconductor substrate by causing a predetermined forward current to flow through the diode when the first transistor is in an off state, wherein
a bonding pad formed on the semiconductor substrate on which the first transistor, the second transistor, and the diode are mounted comprises:
a first bonding pad to which a source or emitter electrode of the first transistor and a cathode electrode of the diode are connected,
a second bonding pad to which a source or emitter electrode of the second transistor and an anode electrode of the diode are connected, and
a third bonding pad to which gate electrodes of the first and second transistors are connected,
the current measurement circuit is configured such that a source voltage of the first transistor is same as the source voltage of the second transistor and no current flows through the diode during current measurement, and is connected to a source electrode of the second transistor via a first switch when a gate control signal of the first transistor is in a high-voltage state, and
the temperature measurement circuit has a power supply that causes a predetermined forward current to flow through the diode, and is connected to the source electrode of the second transistor via a second switch when the gate control signal of the first transistor is in a low-voltage state.

7. The power conversion device according to claim 6, wherein
the current measurement circuit comprises:
an operational amplifier having a negative input terminal connected to the source electrode of the second transistor and a positive input terminal connected to the source electrode of the first transistor, and
a resistance element connected to the negative input terminal and an output terminal of the operational amplifier.

8. The power conversion device according to claim 6, wherein
a cathode region of the diode is formed of a first conductivity type impurity layer forming a source region or an emitter region of the first transistor, and
an anode region of the diode is formed of a second conductivity type impurity layer forming a P-body region or a P-body region connection region of the second transistor.

9. The power conversion device according to claim 6, wherein
the current measurement circuit and the temperature measurement circuit execute a current detection mode and a temperature detection mode in response to a gate signal for controlling the first transistor,
in the current detection mode in which the gate signal is in an on state, the current measurement circuit observes a sense current flowing through the second transistor,
in the temperature detection mode in which the gate signal is in an off state, the temperature measurement circuit calculates a temperature of the semiconductor substrate on a basis of a terminal voltage of the diode, and
a main control current calculation device that calculates a main current flowing through the first transistor from the sense current and the temperature is connected to the current measurement circuit and the temperature measurement circuit.

10. The power conversion device according to claim 9, wherein
the power conversion device is configured as an inverter device provided at least on a low voltage side, and
a control/calculation device that controls a gate drive circuit of a main control transistor calculates the main current flowing through the first transistor and performs feedback control on the gate drive circuit to match a command current for driving a load.

* * * * *